United States Patent [19]

Fujikawa

[11] Patent Number: 6,157,422
[45] Date of Patent: Dec. 5, 2000

[54] TWO-TERMINAL NONLINEAR ELEMENT HAVING INSULATING FILMS OF DIFFERENT THICKNESS FORMED ON THE FLAT TOP SURFACE OF A LOWER ELECTRODE

[75] Inventor: Yohsuke Fujikawa, Tenri, Japan

[73] Assignee: Sharp Kabushiki Kaisha, Osaka, Japan

[21] Appl. No.: 08/907,479

[22] Filed: Aug. 11, 1997

[30] Foreign Application Priority Data

Aug. 26, 1996 [JP] Japan .................................. 8-222952

[51] Int. Cl.[7] .............................. G02F 1/136; G02F 1/135
[52] U.S. Cl. .............................. 349/51; 349/49; 349/52; 349/42; 257/40; 257/43
[58] Field of Search .................. 349/51, 52, 49, 349/42; 257/40, 43

[56] References Cited

U.S. PATENT DOCUMENTS

| | | | |
|---|---|---|---|
| 5,175,114 | 12/1992 | Ono et al. ................................ | 257/40 |
| 5,253,092 | 10/1993 | Takahashi ................................ | 257/40 |
| 5,347,379 | 9/1994 | Kawagishi et al. ...................... | 349/42 |
| 5,396,353 | 3/1995 | Takahashi et al. ...................... | 349/41 |
| 5,661,579 | 8/1997 | Takahashi ................................ | 349/42 |
| 5,909,264 | 6/1999 | Fujikawa et al. ........................ | 349/49 |

FOREIGN PATENT DOCUMENTS 3-26367  4/1991  Japan .

*Primary Examiner*—William L. Sikes
*Assistant Examiner*—Julie Ngo
*Attorney, Agent, or Firm*—Nixon & Vanderhye, PC

[57] ABSTRACT

The two-terminal nonlinear element of this invention includes: a lower electrode having a flat top surface and tapered side walls; a thinner insulating film formed on a portion of the flat top surface of the lower electrode adjacent to the boundary with the tapered side walls; thicker insulating films formed on the flat top surface of the lower electrode except for the portion where the thinner insulating film is formed and on the tapered side walls; and an upper electrode formed on the thinner insulating film.

9 Claims, 9 Drawing Sheets

PRIOR ART

PRIOR ART

TWO-TERMINAL NONLINEAR ELEMENT HAVING INSULATING FILMS OF DIFFERENT THICKNESS FORMED ON THE FLAT TOP SURFACE OF A LOWER ELECTRODE

BACKGROUND OF THE INVENTION

1. Field of the Invention

The present invention relates to a two-terminal nonlinear element, a method for fabricating the same, and a liquid crystal display device using the two-terminal nonlinear element as a driving element.

2. Description of the Related Art

In recent years, liquid crystal display devices have been used as display devices for personal computers, wordprocessors, terminals for office automation, TV sets, and the like since they consume less power and are thin and light in weight. When used for these apparatuses, the liquid crystal display devices must provide a larger capacity display and a higher quality. The liquid crystal display devices are driven by a simple matrix driving method by voltage averaging using TN (twisted nematic) or STN (super twisted nematic) type liquid crystal. This method and type, however, fail to provide a sufficient contrast when the number of scanning lines increases and thus are not suitable for a large capacity display. To overcome this problem, an active matrix driving method has been realized where a display screen is divided into pixels in a matrix and pixel electrodes in respective pixels are connected with individual switching elements. As such switching elements, thin film transistors (TFTs) using amorphous silicon semiconductors and two-terminal nonlinear elements utilizing nonlinear resistance characteristics are used. The two-terminal nonlinear elements are especially promising since liquid crystal display devices using the two-terminal nonlinear elements are simple in structure and thus advantageous in production cost. In particular, a two-terminal nonlinear element having a metal-insulator-metal (MIM) structure (hereinafter, such a two-terminal nonlinear element is referred to as an "MIM element") has already been put into practical use.

FIG. 6 is a structural view of a liquid crystal display device using MIM elements, illustrating the inside of a portion thereof roughly corresponding to one pixel by removing part of a counter substrate. FIG. 7 is a sectional view of a substrate where MIM elements are formed (hereinbelow, such a substrate is referred to as an "MIM-element substrate") taken along line A–A' of FIG. 6.

The MIM-element substrate includes signal lines 3, MIM elements 4, pixel electrodes 5, and the like formed on a glass substrate 1. The counter substrate includes strip-shaped counter electrodes 6 formed on a glass substrate 2 in a direction perpendicular to the signal lines 3. These substrates are laminated together with spacers (not shown) having a predetermined size interposed therebetween, so that they are accurately positioned with respect to each other while securing a space of several micrometers to several tens of micrometers therebetween. A liquid crystal material is then injected in the space between the substrates, thereby to complete the liquid crystal display device. Each of regions where the pixel electrodes 5 and the counter electrodes 6 face each other constitutes a pixel.

Each MIM element 4 is a two-terminal nonlinear element composed of a lower electrode 3a as an extension of the signal line 3, an insulating film 7 formed on the lower electrode 3a, and an upper electrode 8 formed on the insulating film 7. The lower electrode 3a is made of tantalum (Ta), the insulating film 7 is made of tantalum oxide ($TaO_x$), and the upper electrode 8 is made of chromium (Cr), titanium (Ti), or aluminum (Al). The pixel electrode 5 and the counter electrode 6 are made of a transparent conductive material such as ITO (indium tin oxide). Anodic oxidation is often used to form the insulating film 7 made of tantalum oxide. This is preferable because the thickness of the insulating film 7 which may greatly affect the device characteristics can be controlled by varying the formation voltage.

An alignment film 10 is formed over the MIM elements 4 and the pixel electrodes 5 and rubbed in a predetermined direction. An alignment film is also formed over the counter electrodes 6 and rubbed in a predetermined direction. The orientation state of liquid crystal display molecules is determined by the two alignment films. Optical films are attached to the glass substrates 1 and 2 so that a predetermined optical mode can be obtained. When a TN type liquid crystal material is used in a normally white mode, polarizing plates 11 and 12 are attached to the outer surfaces of the glass substrates 1 and 2, respectively.

The MIM element 4 exhibits nonlinear resistance characteristics where the resistance becomes high when a voltage applied between the lower electrode 3a and the upper electrode 8 is low and becomes low when the voltage is high. The liquid crystal display device utilizes the nonlinear resistance characteristics of the MIM elements as the switching characteristics at the application of voltages to the pixel electrodes 5 and the counter electrodes 6, so as to change the orientation state of the liquid crystal molecules. A liquid crystal display device with a higher display quality is obtained as the ratio of the capacitance of the liquid crystal layer ($C_{LC}$) to the capacitance of the MIM element ($CM_{MIM}$) is larger when the MIM element is driven. Therefore, the ratio is normally designed to be about 10 or more.

Such a liquid crystal display device using the MIM elements with the above configuration is advantageous in that the number of production steps is small compared with the case of using TFTs. It has the problems however that size reduction of the MIM elements is difficult and that the insulation of the MIM elements tends to be easily broken. The size reduction of the MIM elements is required as the pitch of the pixels is reduced to effect a large capacity display. That is, in order to secure the ratio of the capacitance of the liquid crystal layer to the capacitance of the MIM element of about 10 or more, the area of the MIM element must be reduced. The capacitance of the MIM element ($C_{MIM}$) may also be reduced by increasing the thickness of the insulating film 7. However, this degrades the sharpness in the voltage-current characteristics of the MIM element and thus is not recommendable. It is therefore required to reduce the area of the MIM element.

The insulating film 7 is made as thin as about 400 to 700 Å to obtain the required device characteristics. This reduces the electrical resistance and thus tends to easily permit the insulation to break. A pixel having an insulation-broken MIM element does not operate normally, generating a point defect.

In order to solve the above problems, Japanese Laid-Open Publication No. 3-26367, for example, proposes a so-called lateral structure where a side wall of the lower electrode is used for the MIM element to reduce the size of the MIM element. A top contact structure utilizing a through hole for preventing the insulation break is also proposed.

The lateral structure will be described with reference to FIGS. 8A and 8B. FIG. 8A is a plan view of one pixel of an MIM-element substrate of a liquid crystal display device using the lateral structure. FIG. 8B is a sectional view taken along line B–B' of FIG. 8A.

The liquid crystal display device shown in FIGS. 8A and 8B includes signal lines 3 and pixel electrodes 5 formed on a glass substrate 1 as in the liquid crystal displayed device shown in FIG. 6. In this conventional liquid crystal display device, however, each MIM element 4 is formed at a side wall of the signal line 3. More specifically, a thinner insulating film 7a having nonlinearity is formed on a side wall of the signal line 3, while a thicker insulating film 7b which does not constitute the MIM element is formed on the top surface of the signal line 3. An upper electrode 8 is formed on the thinner insulating film 7a. Thus, the side wall of the signal line 3, the thinner insulating film 7a, and the upper electrode 8 constitute the MIM element. Since the thinner insulating film 7a having nonlinearity is formed on a side wall of the signal line 3 of which thickness is about 1000 Å, the area of the MIM element is determined by the product of the thickness of the signal line 3 and the width of the upper electrode 8. This makes it possible to fabricate an MIM element much smaller than the limit of exposure precision in photolithography (about several micrometers), reducing the substantial capacitance of the MIM element ($C_{MIM}$). As a result, the ratio of the capacitance of the liquid crystal layer ($C_{LC}$) to the capacitance of the MIM element ($C_{MIM}$) increases even if the patterning precision of the upper electrode is the same.

The top contact structure will be described with reference to FIGS. 9A and 9B. FIG. 9A is a plan view of one pixel of an MIM-element substrate of a liquid crystal display device using the top contact structure. FIG. 9B is a sectional view taken along line C–C' of FIG. 9A.

The insulation break of an MIM element is considered to occur because an electric field is concentrated on an etching end of a lower electrode which serves as part of the nonlinear element and the quality of an insulating film formed over the etching end of the lower electrode is poor. Moreover, since such a poor insulating film over the etching end constitutes the MIM element, the resultant device characteristics tend to be varied. In the top contact structure, the etching end of the lower electrode is not used as part of the MIM element.

One pixel of the liquid crystal display device shown in FIGS. 9A and 9B includes a lower electrode 3a as an extension of a signal line 3, a thinner insulating film 7a having nonlinearity, an upper electrode 8, and a pixel electrode 5 as in the liquid crystal display device shown in FIG. 6. In this conventional liquid crystal display device, however, the thinner insulating film 7a is formed in the bottom of a through hole of a thicker insulating film 13, i.e., surrounded by the thicker insulating film 13, and connected with the upper electrode 8 in the through hole. According to this structure, the etching ends of the lower electrode 3a are not used as part of the MIM element, but are protected with the thicker insulating film 13. This prevents an electric field from concentrating on the etching ends of the lower electrode, reducing point defects and thus improving the production yield.

As described above, the lateral structure realizes the size reduction of MIM elements, and the top contact structure prevents an occurrence of insulation break and reduces the variation in device characteristics. However, there has not been realized a structure where the above two structures are combined to satisfy the size reduction of MIM elements, the prevention of an occurrence of insulation break, and the unification of device characteristics simultaneously. This is because a side wall of the lower electrode is used as a component of the MIM element in the lateral structure, while a portion of the top surface of the lower electrode is used as a component of the MIM element in the top contact structure.

SUMMARY OF THE INVENTION

The two-terminal nonlinear element of this invention includes: a lower electrode having a flat top surface and tapered side walls; a thinner insulating film formed on a portion of the flat top surface of the lower electrode adjacent to the boundary with the tapered side walls; thicker insulating films formed on the flat top surface of the lower electrode except for the portion where the thinner insulating film is formed and on the tapered side walls; and an upper electrode formed on the thinner insulating film.

Alternatively, the two-terminal nonlinear element of this invention includes: a lower electrode having a flat top surface and tapered side walls; a thinner insulating film formed on the flat top surface of the lower electrode; thicker insulating films formed on the thinner insulating film formed on the flat top surface of the lower electrode except for a portion adjacent to the boundary with the tapered side walls and on the tapered side walls; and an upper electrode formed on the thinner insulating film at the portion adjacent to the boundary with the tapered side walls.

According to another aspect of the invention, a method for fabricating a two-terminal nonlinear element is provided. The method includes the steps of: forming a first conductive layer which is to be a lower electrode on a substrate; forming a first insulating film on the first conductive layer; forming a second insulating film on the first insulating film; etching a three-layer structure composed of the first conductive layer, the first insulating film, and the second insulating film so as to have a tapered side wall; forming a thicker insulating film on the tapered side wall of the lower electrode formed by the step of etching a three-layer structure; etching the tapered side wall of the first insulating film to expose a portion of a flat top surface of the lower electrode adjacent to the boundary with the tapered side wall of the lower electrode; forming a thinner insulating film on the exposed portion of the flat top surface of the lower electrode; and forming an upper electrode on the thinner insulating film.

Alternatively, the method for fabricating a two-terminal nonlinear element includes the steps of: forming a first conductive layer which is to be a lower electrode on a substrate; forming a thinner insulating film on the first conductive layer; forming a first insulating film on the thinner insulating film; forming a second insulating film on the first insulating film; etching a four-layer structure composed of the first conductive layer, the thinner insulating film, the first insulating film, and the second insulating film so as to have a tapered side wall; forming a thicker insulating film on the tapered side wall of the lower electrode formed by the step of etching a four-layer structure; etching the tapered side wall of the first insulating film to expose the thinner insulating film on a portion of a flat top surface of the lower electrode adjacent to the boundary with the tapered side wall of the lower electrode; and forming an upper electrode on the exposed thinner insulating film.

In one embodiment of the invention, an etching rate of the first insulating film is greater than an etching rate of the second insulating film.

In another embodiment of the invention, the thicker insulating film formed on the tapered side wall of the lower electrode and the thinner insulating film are formed by anodic oxidation.

According to another aspect of the invention, a liquid crystal display device is provided. The liquid crystal display device includes liquid crystal between a pair of substrates. At least one of the substrates has pixel electrodes arranged in a matrix and signal lines running between the pixel electrodes. The pixel electrodes and the signal lines are connected via two-terminal nonlinear elements. Each of the two-terminal nonlinear elements includes: a lower electrode having a flat top surface and tapered side walls; a thinner insulating film formed on a portion of the flat top surface of the lower electrode adjacent to the boundary with the tapered side walls; thicker insulating films formed on the flat top surface of the lower electrode except for the portion where the thinner insulating film is formed and on the tapered side walls; and an upper electrode formed on the thinner insulating film.

Thus, according to one embodiment of the invention, the thinner insulating film constituting the MIM element occupies only a very small area, allowing the size of the MIM element to be reduced. The etching ends of the lower electrode are not used for the MIM element but are protected with the thicker insulating film. This prevents an occurrence of insulation break and unifies the device characteristics.

According to another embodiment of the invention, the thinner insulating film is formed under the thicker insulating film. By forming the thinner insulating film in such a manner that no pinhole is generated, the insulation between the lower electrode and the upper electrode can be maintained even if a pinhole exists in the thicker insulating film.

According to still another embodiment of the invention, the three-layer structure of the first conductive layer, the first insulating film, and the second insulating film is etched to have a tapered side wall, and the exposed tapered side wall of the first insulating film is etched away so as to expose the portion of the top flat surface of the first conductive layer adjacent to the boundary with the tapered side wall. This eliminates the necessity of using a photomask in the microlithography, and the top contact structure can be obtained.

According to still another embodiment of the invention, the thinner insulating film having the nonlinear characteristics is formed on the first conductive layer before the formation of the first and second insulating films. This makes it possible to form the thinner insulating film under very good conditions, so that an MIM element with desired characteristics can be obtained.

According to still another embodiment of the invention, the etching rate of the first insulating film is larger than that of the second insulating film. Therefore, only the first insulating film can be etched without using a photomask. Also, since the MIM element is formed using the tapered side wall, a size reduction of the MIM element is possible.

According to still another embodiment of the invention, the insulating film is formed by anodic oxidation. Therefore, the characteristics of the MIM element can be controlled with the formation voltage.

According to still another embodiment of the invention, a liquid crystal display device using size-reduced MIM elements having the top contact structure can be obtained.

Thus, the invention described herein makes possible the advantages of (1) providing a two-terminal nonlinear element capable of reducing the size, preventing an occurrence of insulation break, and unifying device characteristics simultaneously, (2) providing a novel method for fabricating such a two-terminal nonlinear element, and (3) providing a liquid crystal display device using such a two-terminal nonlinear element.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

Figure 1A:
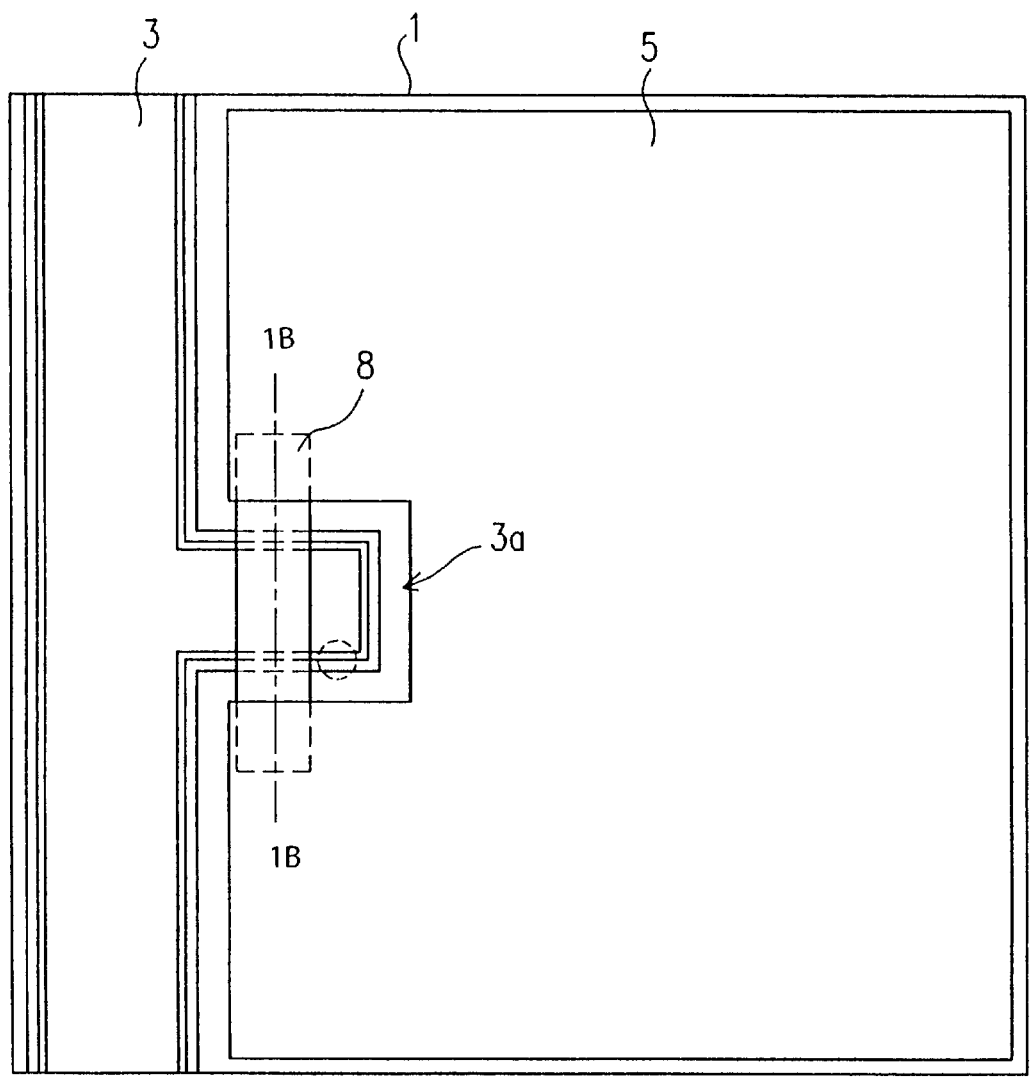
FIG. 1A is a plan view of one pixel of an MIM-element substrate of a liquid crystal display device in Example 1 according to the present invention.
Figure 1B:
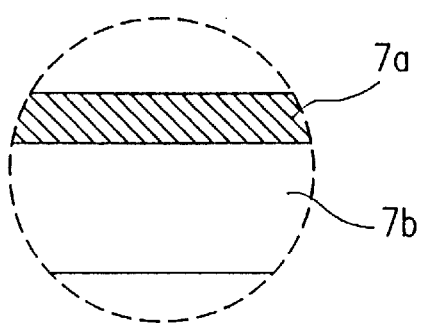
FIG. 1B is an enlarged view of a portion of the MIM-element substrate shown in FIG. 1A.
Figure 2:
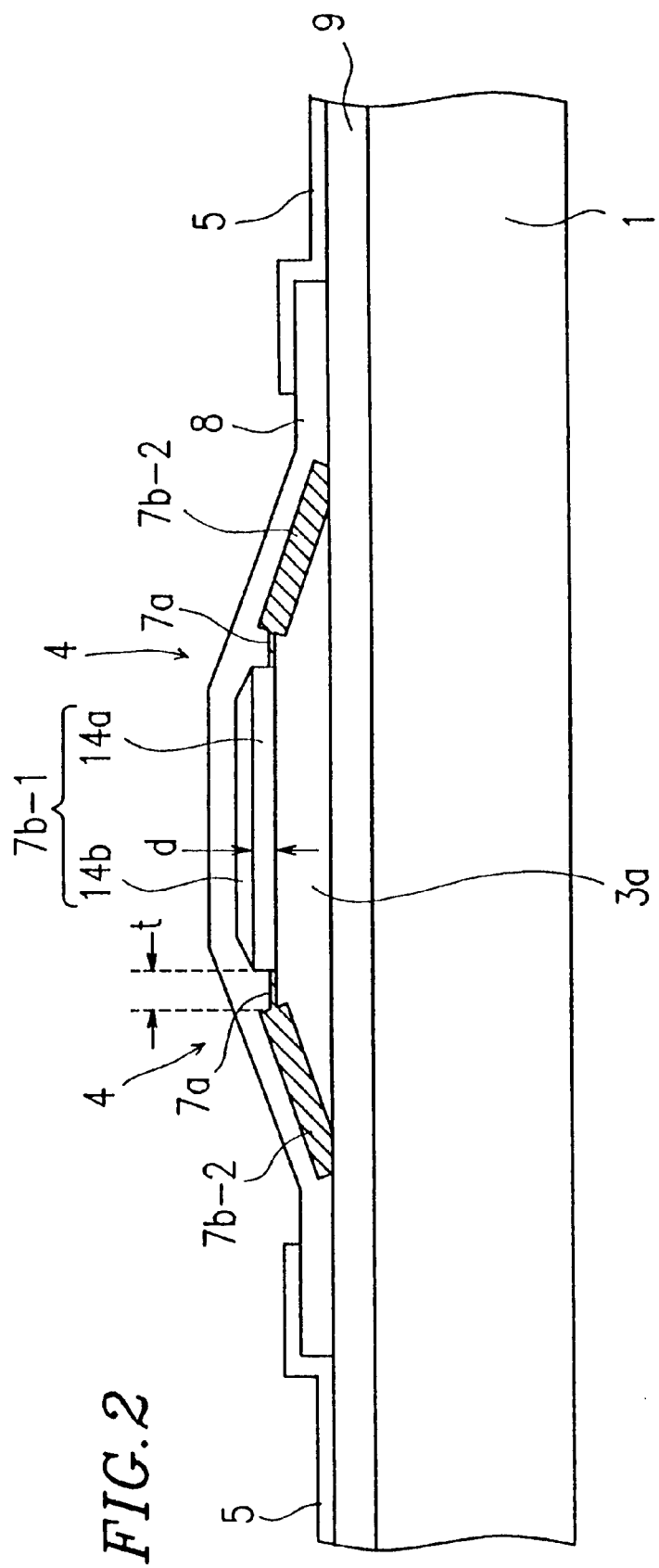
FIG. 2 is a sectional view taken along line D–D' of FIG. 1.

FIG. 1A is a plan view of one pixel of an MIM-element substrate of a liquid crystal display device in Example 1 according to the present invention. FIG. 1B is an enlarged view of a portion of FIG. 1A. In FIG. 1A, a counter substrate provided with counter electrodes and the like is omitted for simplification. FIG. 2 is a sectional view taken along line D–D' of FIG. 1A. In FIG. 2, a polarizing plate and an alignment film are omitted for simplification.

The MIM-element substrate in this example includes signal lines 3, MIM elements 4, and pixel electrodes 5 formed on a glass substrate 1. Each MIM element 4 is composed of a lower electrode 3a as an extension of the signal line 3, a thinner insulating film 7a formed on a portion of the flat top surface of the lower electrode 3a adjacent to the boundary with tapered side walls, a thicker insulating film 7b-1 formed on the flat top surface of the lower electrode 3a except for the portion thereof where the thinner insulating film 7a is formed, and an upper electrode 8 formed over the thinner insulating film 7a and the thicker insulating film 7b-1. The lower electrode 3a is made of tantalum (Ta), the thinner insulating film 7a is made of tantalum oxide ($TaO_x$), and the upper electrode 8 is made of chromium (Cr), titanium (Ti), or aluminum (Al). The pixel electrode 5 is made of a transparent conductive material such as ITO (indium tin oxide). Anodic oxidation is used to form the thinner insulating film 7a made of tantalum oxide. Anodic oxidation is preferable because the thickness of the thinner insulating film 7a which may greatly affect the device characteristics can be controlled by varying the formation voltage.

A method for fabricating such a two-terminal nonlinear element in this example will be described with reference to FIGS. 3A to 3E.

First, an insulating film made of tantalum pentaoxide or the like is formed on the glass substrate 1 as a base coat 9. Such a base coat 9 is preferable because it prevents impurities from entering the two-terminal nonlinear elements and a liquid crystal layer from the glass substrate 1 and improves the adhesion of the signal lines 3, the lower substrates 3a, and the pixel electrodes 5 to the glass substrate 1. In this example, tantalum pentaoxide was deposited on the glass substrate 1 by sputtering to a thickness of about 4000 Å.

A first conductive layer which is to be the signal lines 3 and the lower electrodes 3a and first and second insulating layers which are to constitute the thicker insulating films 7b-1 are formed in this order on the base coat 9. In this example, tantalum (Ta) was deposited by sputtering to a thickness of 3000 Å to form the first conductive layer. $SiO_2$ and then $SiN_x$ were deposited by plasma CVD to a thickness of 2000 Å each to form the first and second insulating layers, respectively. Materials for the first and second insulating layers are selected so that an etching rate E1 of the first insulating layer is greater than an etching rate E2 of the second insulating layer (E1>E2) to allow the first insulating layer to be selectively re-etched at a later step. In this example, the first and second insulating layers were selected so that the etching rate E1 is 20 to 40 Å/s and the etching rate E2 is 2 to 7 Å/s.

Figure 3A:
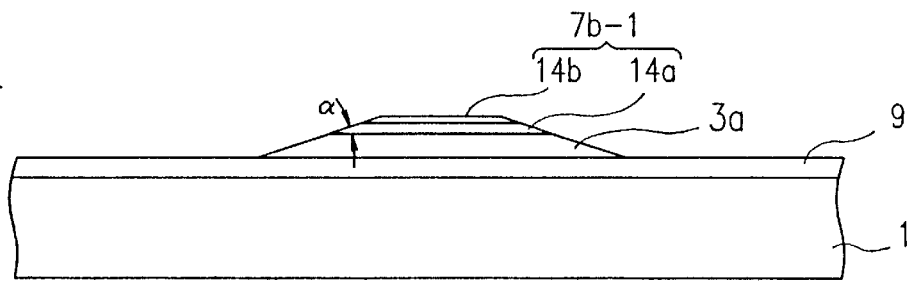
FIGS. 3A to 3E illustrate steps of a method for fabricating a two-terminal nonlinear element in Example 1 according to the present invention.

The thus-formed three-layer structure of the first conductive layer, the first insulating layer, and the second insulating layer is etched into a predetermined shape by photolithography so that the signal lines 3 and the lower electrodes 3a together with first and second insulating films 14a and 14b are formed. In this example, dry etching was performed using $CF_4$ and $O_2$ so that the signal lines 3 and the lower electrodes 3a have tapered side walls with an angle of 20 to 30° as shown in FIG. 3A. Such tapered etching is possible because, in dry etching, the etching rate is substantially the same for any material and anisotropic etching is possible.

Figure 3B:
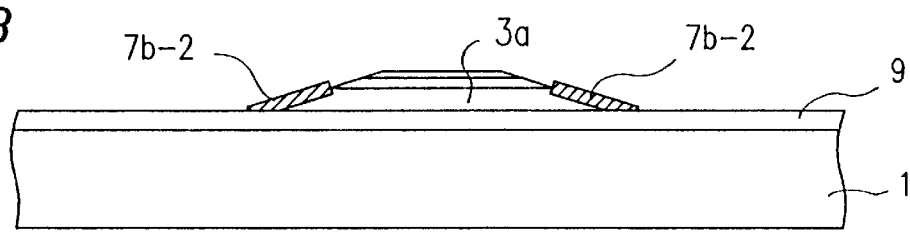

Then, thicker insulating films 7b-2 are formed on the tapered side walls of the signal lines 3 and the lower electrodes 3a (FIG. 3B). In this example, a layer of $Ta_2O_5$ with a thickness of about 3000 Å was formed by anodic oxidation. In the anodic oxidation, anodic oxidation films are formed only on the exposed surfaces of the lower electrodes 3a which are in direct contact with an electrolyte. Thus, anodic oxidation films are not formed on the flat top surfaces of the lower substrates 3a where the first and second insulating films 14a and 14b are formed, but formed on the tapered side walls of the signal lines 3 and the lower electrodes 3a as the thicker insulating films 7b-2.

Figure 3C:
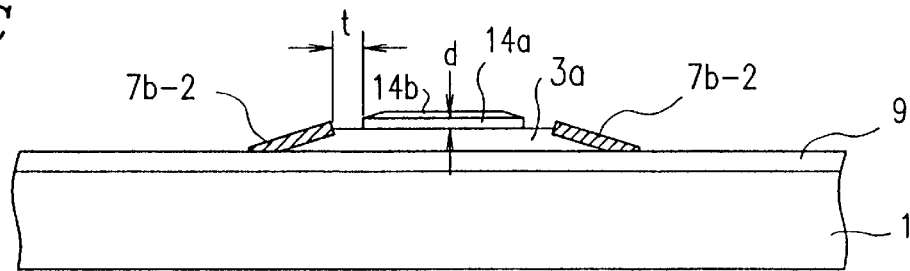

Thereafter, the tapered side walls of the first insulating films 14a which are not covered with the second insulating films 14b are selectively etched to expose the underlying portions of the signal lines 3 and the lower electrodes 3a (FIG. 3C). In this step, since the etching rate of the second insulating films 14b is smaller than that of the first insulating films 14a as described above, the second insulating films 14b serve as a resist for the selective etching of the first insulting films 14a. Therefore, neither application of a resist nor an exposure/development process is required. In this example, the first insulating films 14a were wet-etched using a buffered hydrofluoric acid. At this etching step, the second insulating films 14b are hardly etched while the first insulating films 14a are being etched since the etching rate of the former is smaller than that of the latter. The thicker insulating films 7b-2 formed on the tapered side walls of the signal lines 3 and the lower electrodes 3a, which are made of a tantalum oxide such as tantalum pentaoxide ($Ta_2O_5$), are hardly etched with a buffered hydrofluoric acid. Thus, the exposed portions of the first insulating films 14a located on the flat top surfaces of the signal lines 3 and the lower electrodes 3a adjacent to the boundary with the tapered side walls thereof are selectively removed, exposing slits of the underlying signal lines 3 and lower electrodes 3a.

A width t of the slits is roughly d/tanα, where d is the thickness of the first insulating film 14a and α is the taper angle. The slit width t therefore can be controlled with the thickness d and the taper angle α. In this example, d was 0.2 μm and α was 30° to obtain the slit width of 0.35 μm. Actually, however, since the wet etching employed for the first insulating films 14a is isotropic etching, the edges of the second insulating films 14b and the underlying portions of the first insulating films 14a are also etched. The final slit width is therefore about 0.5 μm.

Figure 3D:
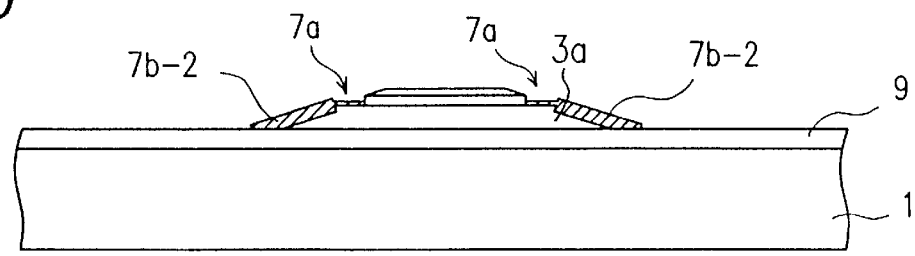

The thinner insulating films 7a having the nonlinear characteristics are then formed (FIG. 3D). In this example, a layer of tantalum pentaoxide ($Ta_2O_5$) with a thickness of about 600 Å was formed by anodic oxidation. The anodic oxidation is preferable because a solid good oxide film can be formed with a reduced variation in the thickness without pinholes generated therein. In the anodic oxidation, since only the surfaces of electrodes which are in direct contact with an electrolyte are selectively oxidized, the thinner insulating films 7a are formed only on the exposed slit portions of the surfaces of the signal lines 3 and the lower electrodes 3a adjacent to the boundary with the tapered wide walls.

Figure 3E:
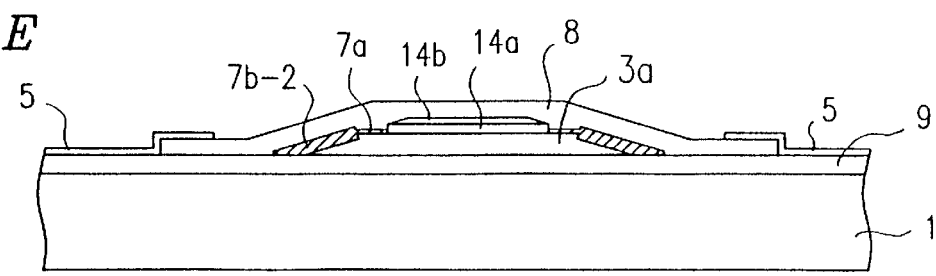

Thereafter, a second conductive layer which is to be the upper electrodes 8 and a transparent conductive layer which is to be the pixel electrodes 5 are formed in this order over the resultant signal lines 3 and lower electrodes 3a (FIG. 3E). In this example, titanium (Ti) was deposited as the second conductive layer and patterned to form the upper electrodes 8 on the lower electrodes 3a. ITO was deposited as the transparent conductive layer and patterned to form the pixel electrodes 5. In this example, each upper electrode 8 was formed to constitute two MIM elements at two positions of the corresponding lower electrode 3a. Alternatively, a separate upper electrode 8 may be formed to constitute each MIM element. In other words, it is only necessary to form the upper electrode over the thinner insulating film 7a.

Thus, the two-terminal nonlinear element according to the present invention can be formed at a portion of the flat top surface of each lower electrode 3a adjacent to the boundary with the tapered side walls thereof. This allows the formation of a small two-terminal nonlinear element. Moreover, the other portion of the flat top surface of each lower electrode 3a and the tapered side walls thereof are covered with the thicker insulating film 7b-1 composed of the first and second insulating films 14a and 14b and the thicker insulating film 7b-2, respectively. This allows the formation of a two-terminal nonlinear element using neither a tapered side wall of the lower electrode which tends to cause an insulation break nor an etching end of the lower electrode. As a result, the above-described conventional problems of the difficulty in size reduction of the two-terminal nonlinear elements and the occurrence of insulation break can be overcome simultaneously. The unification of the device characteristics is also attained. In this example, only three masks used for the formations of the lower electrodes, the upper electrodes, and the pixel electrodes are required to fabricate the MIM-element substrate.

In this example, SiO$_2$ and SiN$_x$ were used for the first and second insulating films 14a and 14b, respectively. Alternatively, any of the combinations of materials shown in Table 1 satisfying the condition that the etching rate of the second insulating film 14b is smaller than that of the first insulating film 14a can be used. These oxide films and nitride films can be formed by plasma CVD or sputtering.

TABLE 1

| 1st insulating film 14a | Etching rate | 2nd insulating film 14b | Etching rate |
|---|---|---|---|
| SiO$_2$ | 20 ~ 40 Å/s | SiNx | 2 ~ 7 Å/s |
| SiO$_2$ | 20 ~ 40 Å/s | Ta$_2$O$_5$ | Barely etched |
| SiNx | 2 ~ 7 Å/s | Ta$_2$O$_5$ | Barely etched |

In this example, the lower electrode 3a was an extension of the signal line 3. Alternatively, a side wall of the signal line 3 may be tapered and a two-terminal nonlinear device may be formed at a portion of the flat top surface of the signal line 3 adjacent to the boundary with the tapered side wall thereof. Also, though two two-terminal nonlinear elements were formed at two portions of the lower electrode 3a in this example, only one two-terminal nonlinear element may be formed.

EXAMPLE 2

Figure 4:
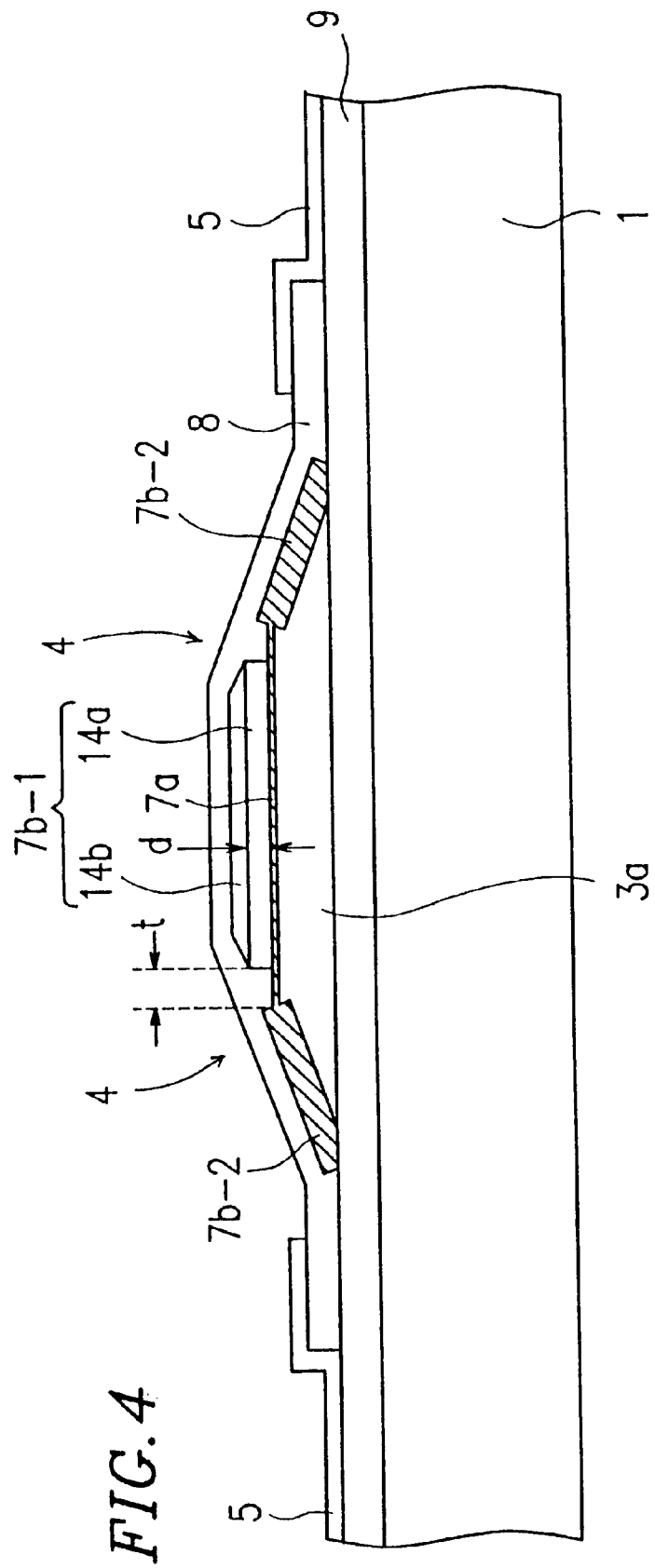
FIG. 4 is a sectional view of one pixel of a liquid crystal display device in Example 2, taken along line D–D' of FIG. 1.
Figure 6:
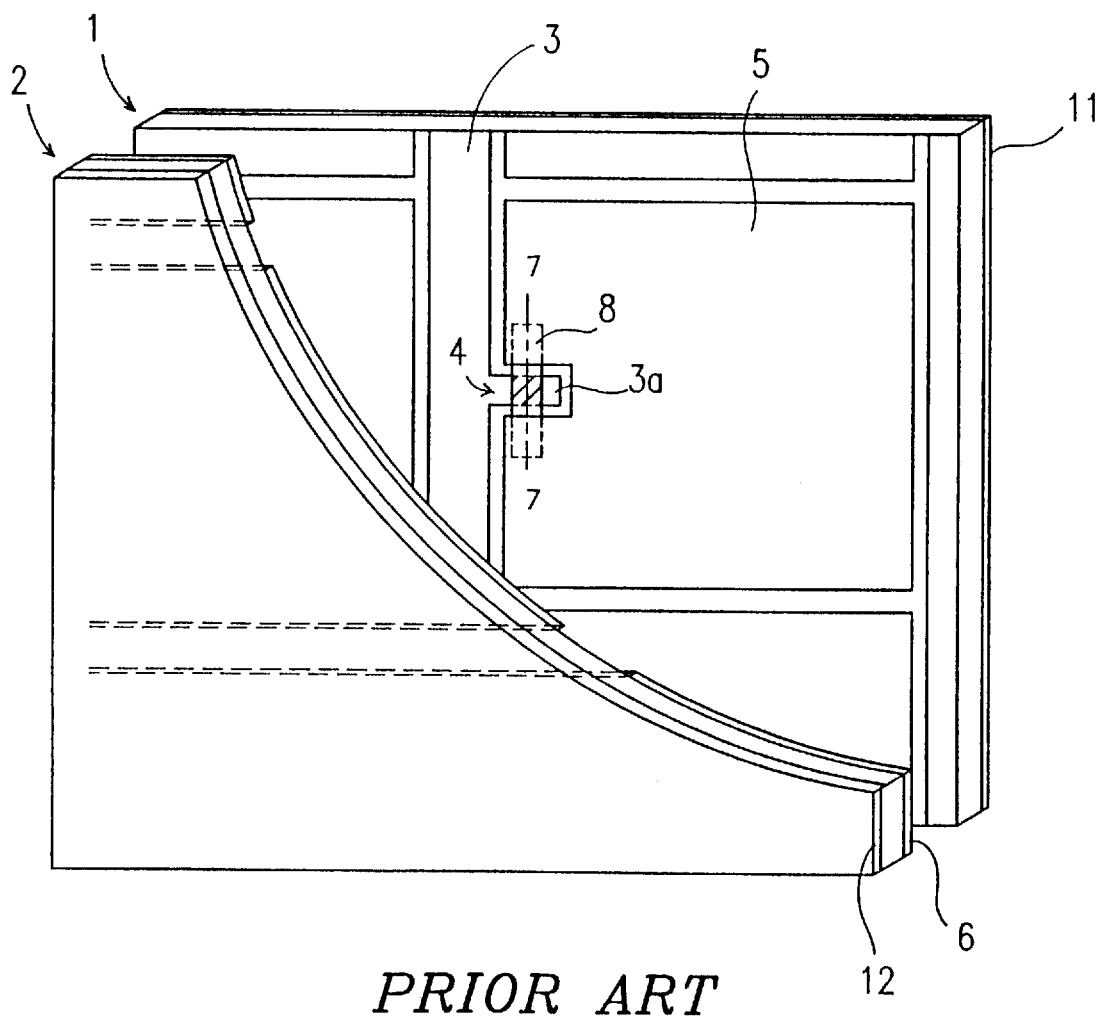
FIG. 6 is a structural view of a conventional liquid crystal display device using MIM elements.
Figure 7:
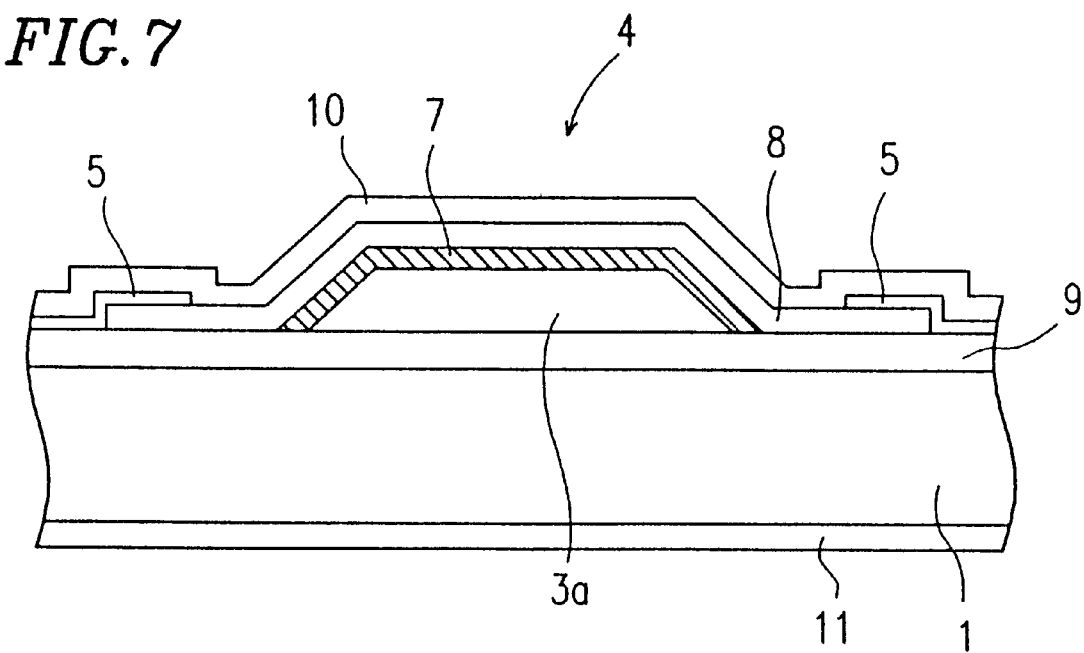
FIG. 7 is a sectional view taken along line A–A' of FIG. 6.
Figure 8A:
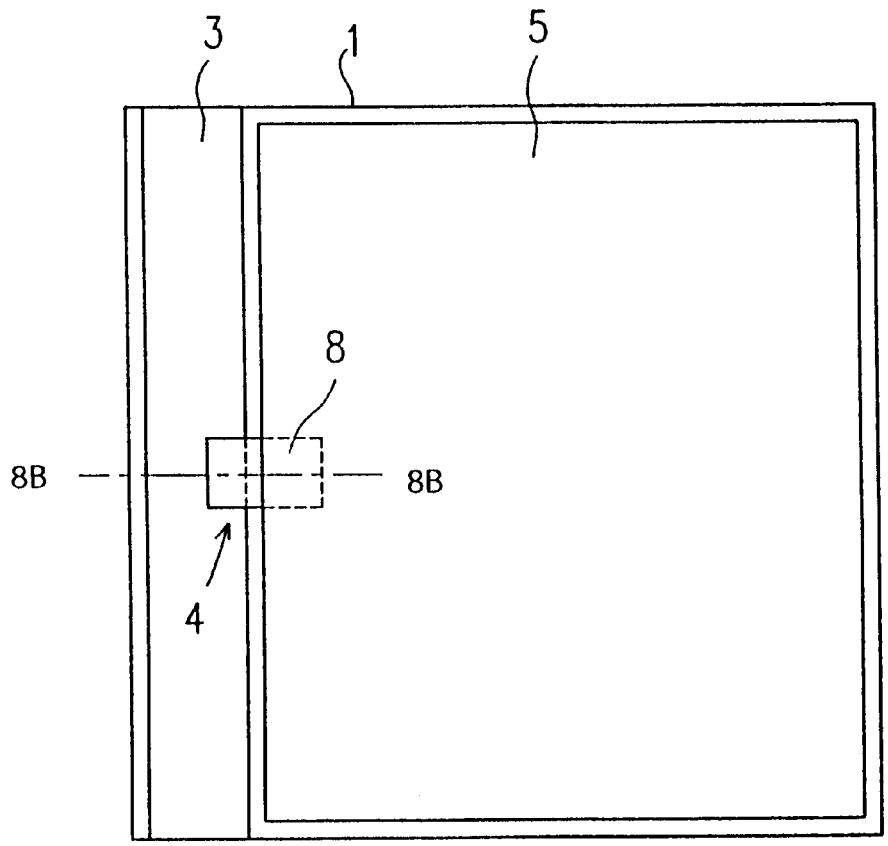
FIG. 8A is a plan view of one pixel for illustrating the lateral structure.
Figure 8B:
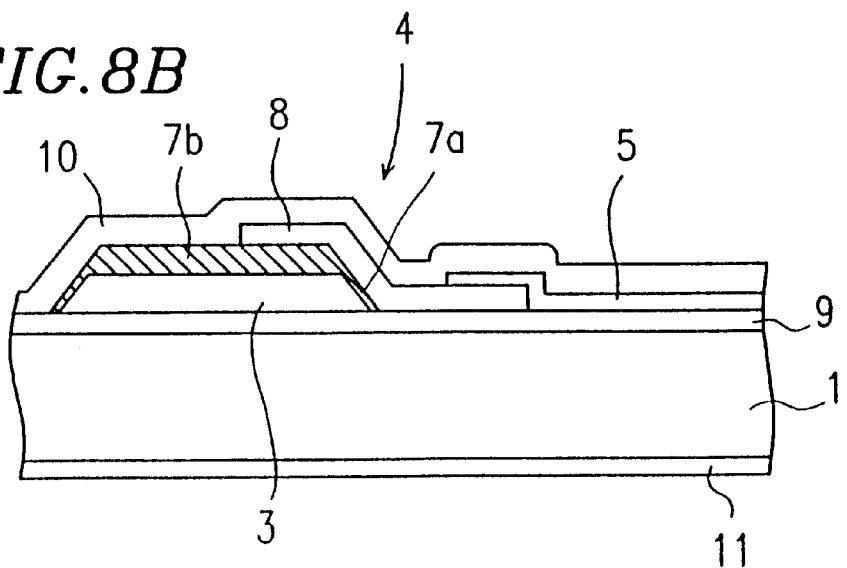
FIG. 8B is a sectional view taken along line B–B' of FIG. 8A.
Figure 9A:
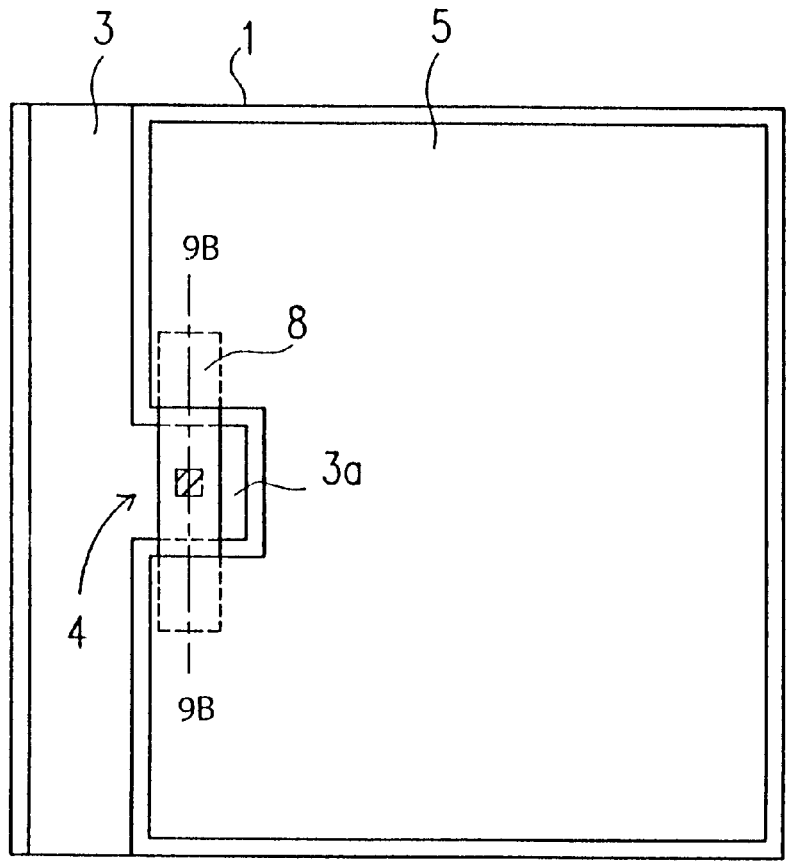
FIG. 9A is a plan view of one pixel for illustrating the top contact structure.
Figure 9B:
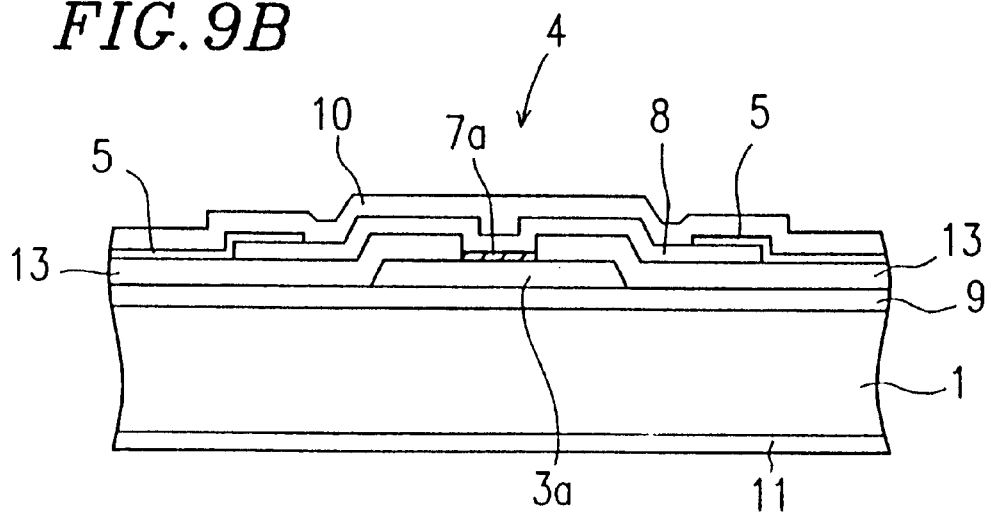
FIG. 9B is a sectional view taken along line C–C' of FIG. 9A.

FIG. 4 shows a two-terminal nonlinear element in Example 2 according to the present invention. The plan view of one pixel of an MIM-element substrate of a liquid crystal display device in this example is the same as FIG. 1A in Example 1, and FIG. 4 is a sectional view taken along line D–D' of FIG. 1A. The structure of the liquid crystal display device in this example is roughly the same as that shown in FIG. 6.

The MIM-element substrate in this example includes signal lines 3, MIM elements 4, and pixel electrodes 5 formed on a glass substrate 1. Each MIM element 4 is composed of a lower electrode 3a as an extension of the signal line 3, a thinner insulating film 7a formed on a portion of the flat top surface of the lower electrode 3a adjacent to the boundary with tapered side walls, a thicker insulating film 7b-1 formed on the flat top surface of the lower electrode 3a except for the portion where the thinner insulating film 7a is formed, and an upper electrode 8 formed over the thinner insulating film 7a and the thicker insulating film 7b-1. In this example, the thinner insulating film is actually formed on the entire flat top surface of the lower electrode 3a, and the thicker insulating film 7b-1 is of a layered structure having the thinner insulating film 7a as the lower layer. The lower electrode 3a is made of tantalum (Ta), the thinner insulating film 7a is made of tantalum oxide (TaO$_x$), and the upper electrode 8 is made of chromium (Cr), titanium (Ti), or aluminum (Al). The pixel electrode 5 is made of a transparent conductive material such as ITO (indium tin oxide). Anodic oxidation is used to form the thinner insulating film 7a made of tantalum oxide. This is preferable because the thickness of the thinner insulating film 7a which may greatly affect the device characteristics can be controlled by varying the formation voltage.

A method for fabricating such a two-terminal nonlinear element in this example will be described with reference to FIGS. 5A to 5D.

First, an insulating film made of tantalum pentaoxide or the like is formed on the glass substrate 1 as a base coat 9. Such a base coat 9 is preferable because it prevents impurities from entering the two-terminal nonlinear elements and a liquid crystal layer from the glass substrate 1 and improves the adhesion of the signal lines 3, the lower substrates 3a, and the pixel electrodes 5 to the glass substrate 1. In this example, tantalum pentaoxide was deposited on the glass substrate 1 by sputtering to a thickness of about 4000 Å.

A first conductive layer which is to be the signal lines 3 and the lower electrodes 3a, an insulating layer which is to be the thinner insulating films 7a, and first and second insulating layers which are to constitute the thicker insulating films 7b-1 are formed in this order on the base coat 9. In this example, tantalum (Ta) was deposited by sputtering to a thickness of 3000 Å to form the first conductive layer. Then, a layer of tantalum pentaoxide (Ta$_2$O$_5$) with a thickness of about 600 Å was formed by anodically oxidizing the first conductive layer to form the insulating layer. This insulating layer exhibits the nonlinear resistance characteristics and is partially used as the insulating film constituting the two-terminal nonlinear element. By the anodic oxidation, a good solid oxide film with reduced generation of pinholes can be formed. Also, since a voltage fall due to a line resistance seldom occurs in the anodic oxidation, there is no variation in the thickness of the insulating film 7a due to a variation in the formation voltage. Thus, the resultant insulating film 7a is uniform and of a good quality. SiO$_2$ and then SiN$_x$ were deposited by plasma CVD to a thickness of 2000 Å each to form the first and second insulating layers, respectively.

Pinholes tend to be generated in an insulating film due to foreign matter entering during the process when the insulating film is formed by plasma CVD. In this example, however, since the thinner insulating film has been formed by anodic oxidation as the underlying layer, pinholes which may be generated in the first and second insulating layers will not cause a short circuit between the lower electrode and the upper electrode. Materials for the first and second insulating layers are selected so that an etching rate E1 of the first insulating layer is greater than an etching rate E2 of the second insulating layer (E1>E2) to allow the first insulating layer to be selectively re-etched at a later step. In this example, the first and second insulating layers were selected so that the etching rate E1 is 20 to 40 Å/s and the etching rate E2 is 2 to 7 Å/s.

Figure 5A:
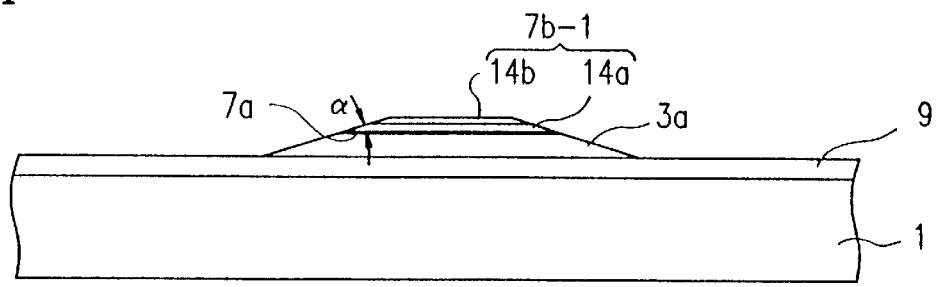
FIGS. 5A to 5D illustrate steps of a method for fabricating a two-terminal nonlinear element in Example 2 according to the present invention.

The thus-formed four-layer structure of the first conductive layer, the insulating layer for the thinner insulating films, the first insulating layer, and the second insulating layer is etched into a predetermined shape by photolithography so that the signal lines 3 and the lower electrodes 3a together with the thin insulating films 7a, the first insulating films 14a, and the second insulating films 14b are formed. In this example, dry etching was performed using CF$_4$ and O$_2$ so that the signal lines 3 and the lower electrodes 3a have tapered side walls with an angle of 20 to 30° as shown in FIG. 5A. Such tapered etching is possible because, in dry etching, the etching rate is substantially the same for any material and anisotropic etching is possible.

Figure 5B:
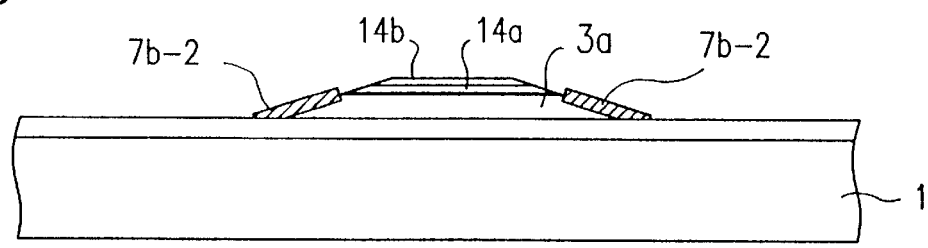

Then, thicker insulating films 7b-2 are formed on the tapered side walls of the signal lines 3 and the lower electrodes 3a (FIG. 5B). In this example, a layer of Ta$_2$O$_5$ with a thickness of about 3000 Å was formed by anodic oxidation. In the anodic oxidation, anodic oxidation films are formed only on the exposed surfaces of the signal lines 3 and the lower electrodes 3a which are in direct contact with an electrolyte. Thus, anodic oxidation films are not formed on the flat top surfaces of the lower electrodes 3a where the first and second insulating films 14a and 14b are formed, but formed on the tapered side walls of the signal lines 3 and the lower electrodes 3a as the thicker insulating films 7b-2.

Figure 5C:
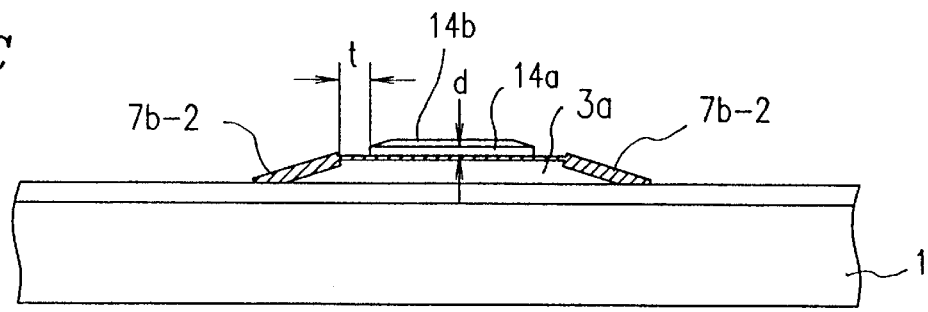

Thereafter, the tapered side walls of the first insulating films 14a which are not covered with the second insulating films 14b are selectively etched to expose the underlying thinner insulating films 7a (FIG. 5C). In this step, since the etching rate of the second insulating films 14b is smaller than that of the first insulating films 14a as described above, the second insulating films 14b serve as a resist for the selective etching of the first insulating films 14a. Therefore, neither application of a resist nor an exposure/development process is required. In this example, the first insulating films 14a were wet-etched using buffered hydrofluoric acid. At this etching step, the second insulating films 14b are hardly etched while the first insulating films 14a are being etched since the etching rate of the former is smaller than that of the latter. The thicker insulating films 7b-2 formed on the tapered side walls of the signal lines 3 and the lower electrodes 3a, which are made of a tantalum oxide such as tantalum pentaoxide ($Ta_2O_5$), are hardly etched with buffered hydrofluoric acid. Thus, the exposed portions of the first insulating films 14a located on the flat top surfaces of the signal lines 3 and the lower electrodes 3a adjacent to the boundary with the tapered side walls thereof are selectively removed, exposing slits of the underlying thinner insulating films 7a.

A width t of the slits is roughly d/tan α where d is the thickness of the first insulating film 14a and α is the taper angle. The slit width t therefore can be controlled with the thickness d and the taper angle α. In this example, d was 0.2 µm and α was 30° to obtain the slit width of 0.35 µm. Actually, however, since the wet etching employed for the first insulating films 14a is isotropic etching, the edges of the second insulating films 14b and the underlying portions of the first insulating films 14a are also etched. The final slit width is therefore about 0.5 µm.

Figure 5D:
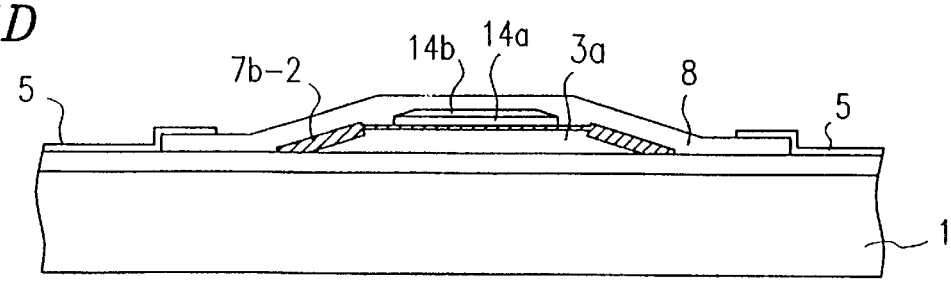

Thereafter, a second conductive layer which is to be the upper electrodes 8 and a transparent conductive layer which is to be the pixel electrodes 5 are formed over the resultant signal lines 3 and lower electrodes 3a (FIG. 5D). In this example, titanium (Ti) was used as the second conductive layer and patterned to form the upper electrodes 8 over the lower electrodes 3a. ITO was used as the transparent conductive layer and patterned to form the pixel electrodes 5. In this example, each upper electrode 8 was formed to constitute two MIM elements at two positions of the corresponding lower electrode 3a. Alternatively, a separate upper electrode 8 may be formed to constitute each MIM element. In other words, it is only necessary to form the upper electrode over the thinner insulating film 7a.

Thus, the two-terminal nonlinear element according to the present invention can be formed at a portion of the flat top surface of each lower electrode adjacent to the boundary with the tapered side walls thereof. This allows the formation of a small two-terminal nonlinear element. Moreover, the other portion of the flat top surface of each lower electrode 3a and the tapered side walls thereof are covered with the thicker insulating film 7b-1 composed of the first and second insulating films 14a and 14b and the thicker insulating film 7b-2, respectively. This allows the formation of a two-terminal nonlinear element using neither a tapered side wall of the lower electrode which tends to cause an insulation break nor an etching end of the lower electrode. As a result, the above-described conventional problems of the difficulty in size reduction of the two-terminal nonlinear elements and the occurrence of insulation break can be overcome simultaneously. The unification of the device characteristics is also attained.

In this example, $SiO_2$ and $SiN_x$ were used for the first and second insulating films 14a and 14b, respectively. Alternatively, any of the combinations of materials shown in Table 1 above satisfying the condition that the etching rate of the second insulating film 14b is smaller than that of the first insulating film 14a can be used. These oxide films and nitride films can be formed by plasma CVD or sputtering.

In this example, the lower electrode 3a was an extension of the signal line 3. Alternatively, a side wall of the signal line 3 may be tapered and a two-terminal nonlinear device may be formed at a portion of the flat top surface of the signal line 3 adjacent to the boundary with the tapered side wall thereof. Also, though two two-terminal nonlinear elements were formed at two portions of the lower electrode 3a in this example, only one two-terminal nonlinear element may be formed.

Thus, according to the present invention, the thinner insulating film constituting the MIM element occupies only a very small area, allowing a reduction in size of the MIM element. The etching ends of the lower electrode are not used for the MIM element but protected with the thicker insulating film. This prevents an occurrence of insulation break and unifies the device characteristics.

According to the present invention, the thinner insulating film is formed under the thicker insulating film. By forming the thinner insulating film in such a manner that no pinhole is generated, the insulation between the lower electrode and the upper electrode can be maintained even if a pinhole exists in the thicker insulating film.

According to the present invention, the three-layer structure of the first conductive layer, the first insulating film, and the second insulating film is etched to have a tapered side wall, and the exposed tapered side wall of the first insulating film is etched away so as to expose the portion of the flat top surface of the first conductive layer adjacent to the boundary with the tapered side wall. This eliminates the necessity of using a photomask in the micro-lithography, and the top contact structure can be obtained.

According to the present invention, the thinner insulating film having the nonlinear characteristics is formed on the first conductive layer before the formation of the first and second insulating films. This makes it possible to form the thinner insulating film under very good conditions, so that an MIM element with desired characteristics can be obtained.

According to the present invention, the etching rate of the first insulating film is larger than that of the second insulating film. Therefore, only the first insulating film can be etched without using a photomask. Also, since the MIM element is formed using the tapered side wall, a size reduction of the MIM element is possible.

According to the present invention, the insulating film is formed by anodic oxidation. Therefore, the characteristics of the MIM element can be controlled with the formation voltage.

According to the present invention, a liquid crystal display device using size-reduced MIM elements having the top contact structure can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A two-terminal nonlinear element comprising:
   a lower electrode having a flat top surface and tapered side walls;
   a thinner insulating film formed on a portion of the flat top surface of the lower electrode adjacent to the boundary with the tapered side walls;
   thicker insulating films formed on the flat top surface of the lower electrode except for the portion where the thinner insulating film is formed and on the tapered side walls; and
   an upper electrode formed on the thinner insulating film.

2. A two-terminal nonlinear element comprising:
   a lower electrode having a flat top surface and tapered side walls;
   a thinner insulating film formed on the flat top surface of the lower electrode;
   thicker insulating films formed on the thinner insulating film formed on the flat top surface of the lower electrode except for a portion adjacent to the boundary with the tapered side walls and on the tapered side walls; and
   an upper electrode formed on the thinner insulating film at the portion adjacent to the boundary with the tapered side walls.

3. A method for fabricating a two-terminal nonlinear element, comprising the steps of:
   forming a first conductive layer which is to be a lower electrode on a substrate;
   forming a first insulating film on the first conductive layer;
   forming a second insulating film on the first insulating film;
   etching a three-layer structure composed of the first conductive layer, the first insulating film, and the second insulating film so as to have a tapered side wall;
   forming a thicker insulating film on the tapered side wall of the lower electrode formed by the step of etching a three-layer structure;
   etching the tapered side wall of the first insulating film and the second insulating film to expose a portion of a flat top surface of the lower electrode adjacent to the boundary with the tapered side wall of the lower electrode;
   forming a thinner insulating film on the exposed portion of the flat top surface of the lower electrode; and
   forming an upper electrode on the thinner insulating film.

4. A method for fabricating a two-terminal nonlinear element according to claim 3, wherein an etching rate of the first insulating film is greater than an etching rate of the second insulating film.

5. A method for fabricating a two-terminal nonlinear element according to claim 3, wherein the thicker insulating film formed on the tapered side wall of the lower electrode and the thinner insulating film are formed by anodic oxidation.

6. A method for fabricating a two-terminal nonlinear element, comprising the steps of:
   forming a first conductive layer which is to be a lower electrode on a substrate;
   forming a thinner insulating film on the first conductive layer;
   forming a first insulating film on the thinner insulating film;
   forming a second insulating film on the first insulating film;
   etching a four-layer structure composed of the first conductive layer, the thinner insulating film, the first insulating film, and the second insulating film so as to have a tapered side wall;
   forming a thicker insulating film on the tapered side wall of the lower electrode formed by the step of etching a four-layer structure;
   etching the tapered side wall of the first insulating film and second insulating film to expose the thinner insulating film on a portion of a flat top surface of the lower electrode adjacent to the boundary with the tapered side wall of the lower electrode; and
   forming an upper electrode on the exposed thinner insulating film.

7. A method for fabricating a two-terminal nonlinear element according to claim 6, wherein an etching rate of the first insulating film is greater than an etching rate of the second insulating film.

8. A method for fabricating a two-terminal nonlinear element according to claim 6, wherein the thicker insulating film formed on the tapered side wall of the lower electrode and the thinner insulating film are formed by anodic oxidation.

9. A liquid crystal display device including liquid crystal between a pair of substrates, at least one of the substrates having pixel electrodes arranged in a matrix and signal lines running between the pixel electrodes, the pixel electrodes and the signal lines being connected via two-terminal nonlinear elements,
   wherein each of the two-terminal nonlinear elements comprising:
      a lower electrode having a flat top surface and tapered side walls;
      a thinner insulating film formed on a portion of the flat top surface of the lower electrode adjacent to the boundary with the tapered side walls;
      thicker insulating films formed on the flat top surface of the lower electrode except for the portion where the thinner insulating film is formed and on the tapered side walls; and
      an upper electrode formed on the thinner insulating film.

* * * * *